(12) United States Patent
Bjorner et al.

(10) Patent No.: US 7,640,354 B2
(45) Date of Patent: Dec. 29, 2009

(54) SCALABLE DIFFERENTIAL COMPRESSION OF NETWORK DATA

(75) Inventors: Nikolaj Skallerud Bjorner, Woodinville, WA (US); Mark Steven Manasse, San Francisco, CA (US); Guilherme Issao Camarinha Fujiwara, Sao Paulo (BR)

(73) Assignee: Microsoft Corporation, Redmond, WA (US)

( * ) Notice: Subject to any disclaimer, the term of this patent is extended or adjusted under 35 U.S.C. 154(b) by 528 days.

(21) Appl. No.: 11/565,867

(22) Filed: Dec. 1, 2006

(65) Prior Publication Data
US 2008/0133536 A1    Jun. 5, 2008

(51) Int. Cl.
*G06F 15/16* (2006.01)

(52) U.S. Cl. .................. 709/231; 709/216; 709/217; 709/218; 709/238; 707/7; 707/10

(58) Field of Classification Search ............ 707/7, 707/10; 709/216, 217, 218, 238
See application file for complete search history.

(56) References Cited

U.S. PATENT DOCUMENTS

2002/0156785 A1* 10/2002 Kumar et al. ............... 707/10
2005/0262167 A1* 11/2005 Teodosiu et al. ............ 707/204
2006/0047855 A1*  3/2006 Gurevich et al. ............ 709/247
2006/0184652 A1*  8/2006 Teodosiu et al. ............ 709/221
2006/0271540 A1* 11/2006 Williams .................... 707/7
2006/0271559 A1* 11/2006 Stavrakos et al. ........... 707/10
2006/0277178 A1* 12/2006 Wang ......................... 707/7
2007/0198710 A1*  8/2007 Gopalakrishnan .......... 709/225
2007/0203909 A1*  8/2007 Marathe ..................... 707/7
2007/0276836 A1* 11/2007 Chatterjee et al. .......... 707/10
2008/0114859 A1*  5/2008 Orzen ........................ 709/218

* cited by examiner

*Primary Examiner*—Nathan Flynn
*Assistant Examiner*—Aftab Nasir Khan
(74) *Attorney, Agent, or Firm*—Workman Nydegger (57) ABSTRACT

The present invention extends to methods, systems, and computer program products for scalable differential compression for network data. Network data exchanged between Wide Area Network ("WAN") acceleration devices is cached at physical recordable-type computer-readable media having (potentially significantly) larger storage capacities than available system memory. The cached network data is indexed through features taken from a subset of the cached data (e.g., per segment) to reduce overhead associated with searching for cached network data to use for subsequent compression. When a feature match is detected between received and cached network data, the cached network data can be loaded from the physical recordable-type computer-readable media into system memory to facilitate data compression between Wide Area Network ("WAN") acceleration devices more efficiently.

20 Claims, 9 Drawing Sheets

SCALABLE DIFFERENTIAL COMPRESSION OF NETWORK DATA

CROSS-REFERENCE TO RELATED APPLICATIONS

Not Applicable.

BACKGROUND

1. Background and Relevant Art

Computer systems and related technology affect many aspects of society. Indeed, the computer system's ability to process information has transformed the way we live and work. Computer systems now commonly perform a host of tasks (e.g., word processing, scheduling, accounting, etc.) that prior to the advent of the computer system were performed manually. More recently, computer systems have been coupled to one another and to other electronic devices to form both wired and wireless computer networks over which the computer systems and other electronic devices can transfer electronic data. Accordingly, the performance of many computing tasks are distributed across a number of different computer systems and/or a number of different computing components.

For example, many businesses have a main office and one or more branch offices at various different geographical locations. Each office can have varying quantities and configurations of computer systems. Some businesses consolidate computing functionality at a main office and push services and applications from the main officer out to branch offices. This conserves costs since only one facility and trained personnel are needed to maintain the computing functionality.

However, this also results in more data being transferred across Wide Area Networks ("WANs") between the main and branch offices. Many businesses that push services and applications, at least from time to time, transfer quantities of data that approach, or even exceed, the capacity of their Wide Area links. This results in depleted bandwidth and increases end-user wait times, which can make collaboration between offices difficult, if not impossible.

One aspect of retrieving data from a main office as opposed to a branch office, is that the transferred data may have been exchanged before, or includes only small modifications of previously transferred data. That is, data may be downloaded from a site, modified, and subsequently loaded back to the site. For example, a document stored on a server at main office can be opened in a word processor at a branch officer, modified, and subsequently saved from the branch office back to the main office.

Various WAN optimizations have been developed to improve use-experience between a branch and a main office, for example, in environments where similar (or exact) data is exchanged multiple times. Data compression is an example of one WAN optimization that can be used to conserver bandwidth and improve user experience. More precisely, local differential compression algorithms can utilize previously transferred data for compressing the new data.

An intermediate computer system (between a sending and receiving computer system), such as, for example, a WAN accelerator, can maintain a cache of previously transferred data. When new data for transfer is received, the intermediate computer system refers to the cache to determine if the new data is at least similar (and potentially identical) to previously transferred data. When a match is found, this indicates to the intermediate computer system that another intermediate computer system (relatively closer to receiving computer system) also has the previously transferred data cached. Thus, the intermediate computer system replaces the matching data with an offset and length into the previously transferred (cached) data. Accordingly, the intermediate computer system then transfers a combination of one or more lengths and offsets for matched data along with the bytes of any unmatched data, instead of transferring bytes for all of the new data. Transferring lengths and offsets for matching data consumes considerably less bandwidth than re-transferring the data itself Typical local differential compression algorithms work with a relatively high level of precision by maintaining a suffix-tree of a window of scanned data. The suffix tree is used to compress the currently scanned bytes. The size of the suffix tree is queried and modified at every byte position. Thus, the suffix tree is typically cached, for example, in volatile L1 or L2 cache associated with a processor, in order to make compression work efficiently.

However, memory constraints limit the amount of time data remains compressible. For example, older data may be removed from the cache to make way for newer data even though a reasonable likelihood exists that the older data will be transferred again. Unfortunately, if the older data is transferred again, no compression is available and the bytes of older data are instead transferred, unnecessarily consuming network bandwidth.

Some scalability may be available at intermediate computer systems by adding more system memory. However, practical limitations, such as, for example, cost, system capability, etc., can still limit cache size. Thus, in some environments, (even those environments with intermediate computer systems having the maximum allowable amount of system memory) previously transferred data can still be prematurely removed from cache.

BRIEF SUMMARY

The present invention extends to methods, systems, and computer program products for scalable differential compression of network data. In some embodiments, a WAN accelerator stores network data for subsequent use in compressing retransmission of the network data. The Wide Area Network (WAN) accelerator receives a stream of content from an originating computer system that is to be transferred access a WAN to an end-user computer system. The WAN accelerator separates portions of the stream of content into corresponding chunks in a buffer. The WAN accelerator hashes each of the corresponding chunks to generate a list of representative hash values in accordance with a first hash algorithm.

The WAN accelerator segments the list of representative hash values into segments. Each segment includes one or more consecutive representative hash values from the list of representative hash values. The WAN accelerator selects a selected hash value from among the representative hash values in each segment. The WAN accelerator hashes the chunk corresponding to each selected hash value to generate a feature hash value for each corresponding segment in accordance with a second different hash algorithm.

The WAN accelerator searches a trait table for each feature hash value. The trait table includes feature hash values for previously transferred streams of content and corresponding unit identifiers for dictionary units containing content from the previously transferred streams of content. The WAN accelerator determines that each feature hash value is not included in the trait table. The WAN accelerator stores a new dictionary unit containing the chunks from the buffer at a physical recordable-type computer-readable medium. The dictionary unit associates each chunk with its representative hash value.

The WAN accelerator establishes a unit identifier for the new dictionary unit. The WAN accelerator stores each feature hash value along with the established unit identifier in the trait table to indicate that each feature hash value identifies a feature of the chunks contained in the new dictionary unit. Accordingly, reference to the dictionary unit can be used to accelerate subsequent end-user computer system access to content contained in the chunks.

In other embodiments, a WAN accelerator utilizes a dictionary to compress network data. For example, in response to searching a trait table, a WAN accelerator instead detects a match of one or more feature hash values to feature hash values of a unit identifier included in the trait table. The unit identifier corresponds to a dictionary unit previously stored at physical recordable-type computer-readable medium of the WAN accelerator. Detecting a match indicates that previously sent (or received) data is likely similar to current sent data. Thus, it is likely that the current sent data is stored at physical recordable-type computer-readable medium of another WAN accelerator associated with the end-user computer system.

The WAN accelerator loads the dictionary unit from the physical recordable-type computer-readable medium into system memory. The WAN accelerator matches at least one representative hash value to a hash value in the dictionary unit. The WAN accelerator formulates an instruction for accessing the content corresponding to the representative hash value. The instruction indicates how the other WAN accelerator is to access content from the dictionary unit. The WAN accelerator sends the instruction to the WAN accelerator such that the other WAN accelerator can access the content without requiring the content to be transferred over the WAN.

In additional embodiments, a WAN accelerator decompresses network data. The WAN accelerator receives an instruction from another WAN accelerator indicating how to access content from a dictionary unit stored at a physical recordable-type computer-readable medium. The WAN accelerator loads the dictionary unit from the physical recordable-type computer-readable medium into system memory. The WAN accelerator accesses content from the dictionary unit in accordance with the instruction.

The WAN accelerator integrates the accessed content from the dictionary unit into other content received from the other WAN accelerator to form a stream of content for delivery to the end-user computer system. The WAN accelerator sends the stream of content to the end-user computer system. The stream of content matches a stream of content sent from an originating computer system to the other WAN accelerator and indicated for delivery to the end-user computer system.

This summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features of the invention can be obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION

The present invention extends to methods, systems, and computer program products for scalable differential compression of network data. In some embodiments, a WAN accelerator stores network data for subsequent use in compressing retransmission of the network data. The Wide Area Network (WAN) accelerator receives a stream of content from an originating computer system that is to be transferred access a WAN to an end-user computer system. The WAN accelerator separates portions of the stream of content into corresponding chunks in a buffer. The WAN accelerator hashes each of the corresponding chunks to generate a list of representative hash values in accordance with a first hash algorithm.

The WAN accelerator segments the list of representative hash values into segments. Each segment includes one or more consecutive representative hash values from the list of representative hash values. The WAN accelerator selects a selected hash value from among the representative hash values in each segment. The WAN accelerator hashes the chunk corresponding to each selected hash value to generate a feature hash value for each corresponding segment in accordance with a second different hash algorithm.

The WAN accelerator searches a trait table for each feature hash value. The trait table includes feature hash values for previously transferred streams of content and corresponding unit identifiers for dictionary units containing content from the previously transferred streams of content. The WAN accelerator determines that each feature hash value is not included in the trait table. The WAN accelerator stores a new dictionary unit containing the chunks from the buffer at a physical recordable-type computer-readable medium. The dictionary unit associates each chunk with its representative hash value.

The WAN accelerator establishes a unit identifier for the new dictionary unit. The WAN accelerator stores each feature hash value along with the established unit identifier in the trait table to indicate that each feature hash value identifies a feature of the chunks contained in the new dictionary unit. Accordingly, reference to the dictionary unit can be used to accelerate subsequent end-user computer system access to content contained in the chunks.

In other embodiments, a WAN accelerator utilizes a dictionary to compress network data. For example, in response to searching a trait table, a WAN accelerator instead detects a match of one or more feature hash values to feature hash values of a unit identifier included in the trait table. The unit identifier corresponds to a dictionary unit previously stored at physical recordable-type computer-readable medium of the WAN accelerator. Detecting a match indicates that previously sent (or received) data is likely similar to current sent data. Thus, it is likely that the current sent data is stored at physical recordable-type computer-readable medium of another WAN accelerator associated with the end-user computer system.

The WAN accelerator loads the dictionary unit from the physical recordable-type computer-readable medium into system memory. The WAN accelerator matches at least one representative hash value to a hash value in the dictionary unit. The WAN accelerator formulates an instruction for accessing the content corresponding to the representative hash value. The instruction indicates how the other WAN accelerator is to access content from the dictionary unit. The WAN accelerator sends the instruction to the WAN accelerator such that the other WAN accelerator can access the content without requiring the content to be transferred over the WAN.

In additional embodiments, a WAN accelerator decompresses network data. The WAN accelerator receives an instruction from another WAN accelerator indicating how to access content from a dictionary unit stored at a physical recordable-type computer-readable medium. The WAN accelerator loads the dictionary unit from the physical recordable-type computer-readable medium into system memory. The WAN accelerator accesses content from the dictionary unit in accordance with the instruction.

The WAN accelerator integrates the accessed content from the dictionary unit into other content received from the other WAN accelerator to form a stream of content for delivery to the end-user computer system. The WAN accelerator sends the stream of content to the end-user computer system. The stream of content matches a stream of content sent from an originating computer system to the other WAN accelerator and indicated for delivery to the end-user computer system.

Embodiments of the present invention may comprise a special purpose or general-purpose computer including computer hardware, as discussed in greater detail below. Embodiments within the scope of the present invention also included non-transitory computer readable storage media for carrying or having computer-executable instructions or data structures stored thereon. Such non-transitory computer readable storage media can be any available media that can be accessed by a general purpose or special purpose computer. By way of example, and not limitation, non-transitory computer readable storage media can comprise physical (or recordable type) computer-readable storage media, such as, RAM, ROM, EEPROM, CD-ROM or other optical disk storage, magnetic disk storage or other magnetic storage devices, or any other medium which can be used to store desired program code means in the form of computer-executable instructions or data structures and which can be accessed by a general purpose or special purpose computer.

In this description and in the following claims, a "network" is defined as one or more data links that enable the transport of electronic data between computer systems and/or modules. When information is transferred or provided over a network or another communications connection (either hardwired, wireless, or a combination of hardwired or wireless) to a computer, the computer properly views the connection as a computer-readable medium. Thus, by way of example, and not limitation, computer-readable media can also comprise a network or data links which can be used to carry or store desired program code means in the form of computer-executable instructions or data structures and which can be accessed by a general purpose or special purpose computer.

Computer-executable instructions comprise, for example, instructions and data which cause a general purpose computer, special purpose computer, or special purpose processing device to perform a certain function or group of functions. The computer executable instructions may be, for example, binaries, intermediate format instructions such as assembly language, or even source code. Although the subject matter has been described in language specific to structural features and/or methodological acts, it is to be understood that the subject matter defined in the appended claims is not necessarily limited to the described features or acts described above. Rather, the described features and acts are disclosed as example forms of implementing the claims.

Those skilled in the art will appreciate that the invention may be practiced in network computing environments with many types of computer system configurations, including, personal computers, desktop computers, laptop computers, message processors, hand-held devices, multi-processor systems, microprocessor-based or programmable consumer electronics, network PCs, minicomputers, rack mounted servers, mainframe computers, mobile telephones, PDAs, pagers, and the like. The invention may also be practiced in distributed system environments where local and remote computer systems, which are linked (either by hardwired data links, wireless data links, or by a combination of hardwired and wireless data links) through a network, both perform tasks. In a distributed system environment, program modules may be located in both local and remote memory storage devices.

Figure 1A:
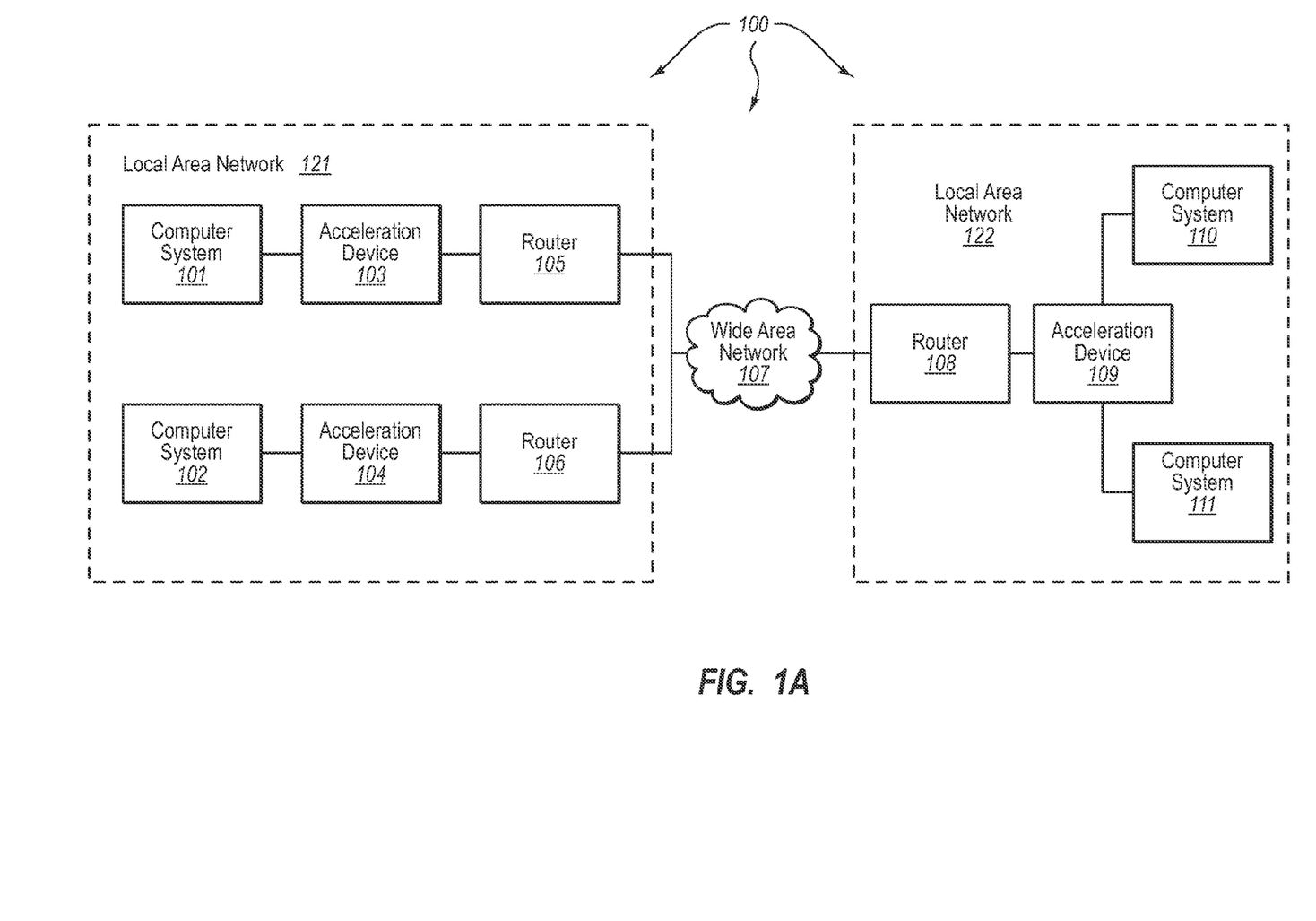
FIGS. 1A and 1B illustrate an example computer architecture that facilitates scalable differential compression of network data.

FIG. 1A illustrates an example computer architecture 100 that facilitates scalable differential compression of network data. As depicted in computer architecture 100, the components of Local Area Network ("LAN") 121 and the components of LAN 122 communicate with one another over Wide Area Network ("WAN") 107 (e.g., a corporate WAN, the Internet, etc.). LAN 121 includes computer systems 101 and 102, acceleration devices 103 and 104, and routers 105 and 106. LAN 122 includes computer systems 110 and 111, acceleration device 109, and router 108. As depicted, acceleration devices 103, 104, and 108 are situated on the communication paths between a router and one or more corresponding computer systems. Thus, computer architecture 100 can be referred to as an "On-LAN Deployment."

Figure 1B:
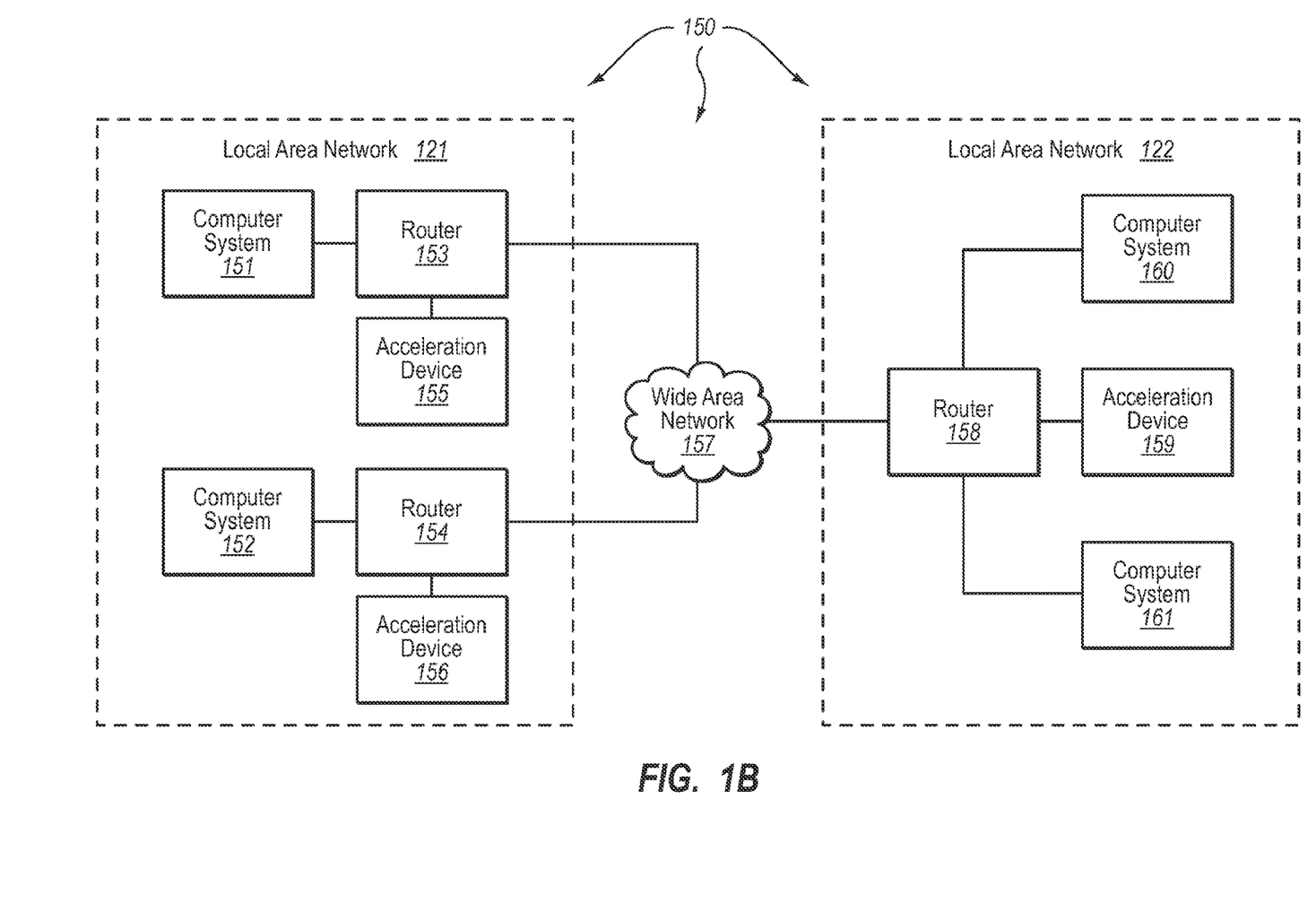

FIG. 1B illustrates another example computer architecture 150 that facilitates scalable differential compression of network data. As depicted in computer architecture 150, the components of Local Area Network ("LAN") 171 and the components of LAN 172 communicate with one another over Wide Area Network ("WAN") 157. LAN 171 includes computer systems 151 and 152, acceleration devices 153 and 154, and routers 155 and 156. LAN 172 includes computer systems 160 and 161, acceleration device 159, and router 158. As depicted, acceleration devices 103, 104, and 108 are situated off of the communication paths between a router and one or more corresponding computer systems. Thus, computer architecture 150 can be referred to as an "Off-LAN Deployment." As such, it may be that an off-LAN acceleration device, such as, for example, acceleration device 159, services a plurality of computer systems. Accordingly, the acceleration device and appropriate router (e.g., router 158) can use cache protocol 173, such as, for example, Web Cache Communication Protocol ("WCCP"), to facilitate the transfer of network data (both compressed and uncompressed) to serviced computer systems.

Figure 2A:
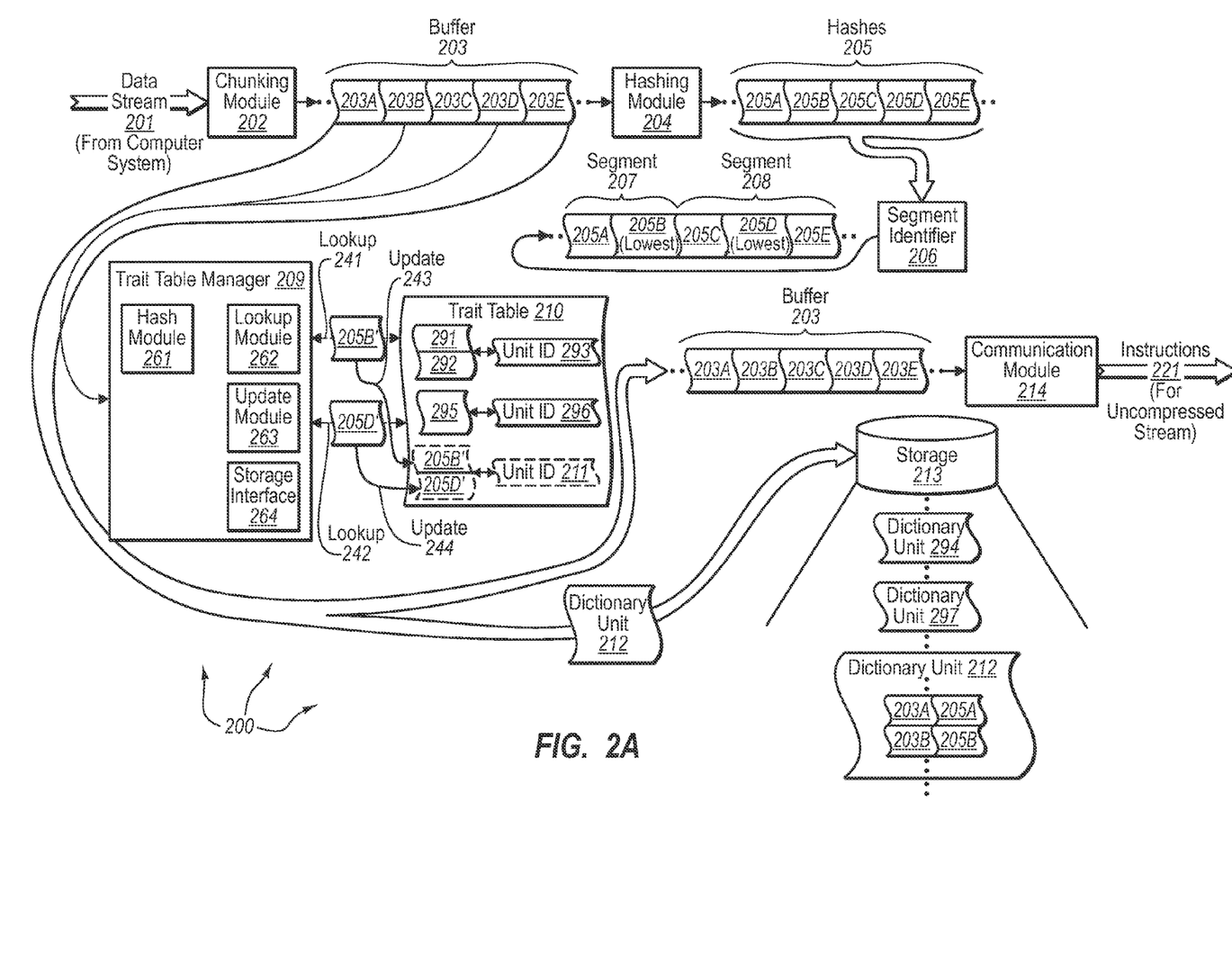
FIG. 2A illustrates an example Wide Area Network accelerator architecture configured to store network data for scalable differential compression.
Figure 2B:
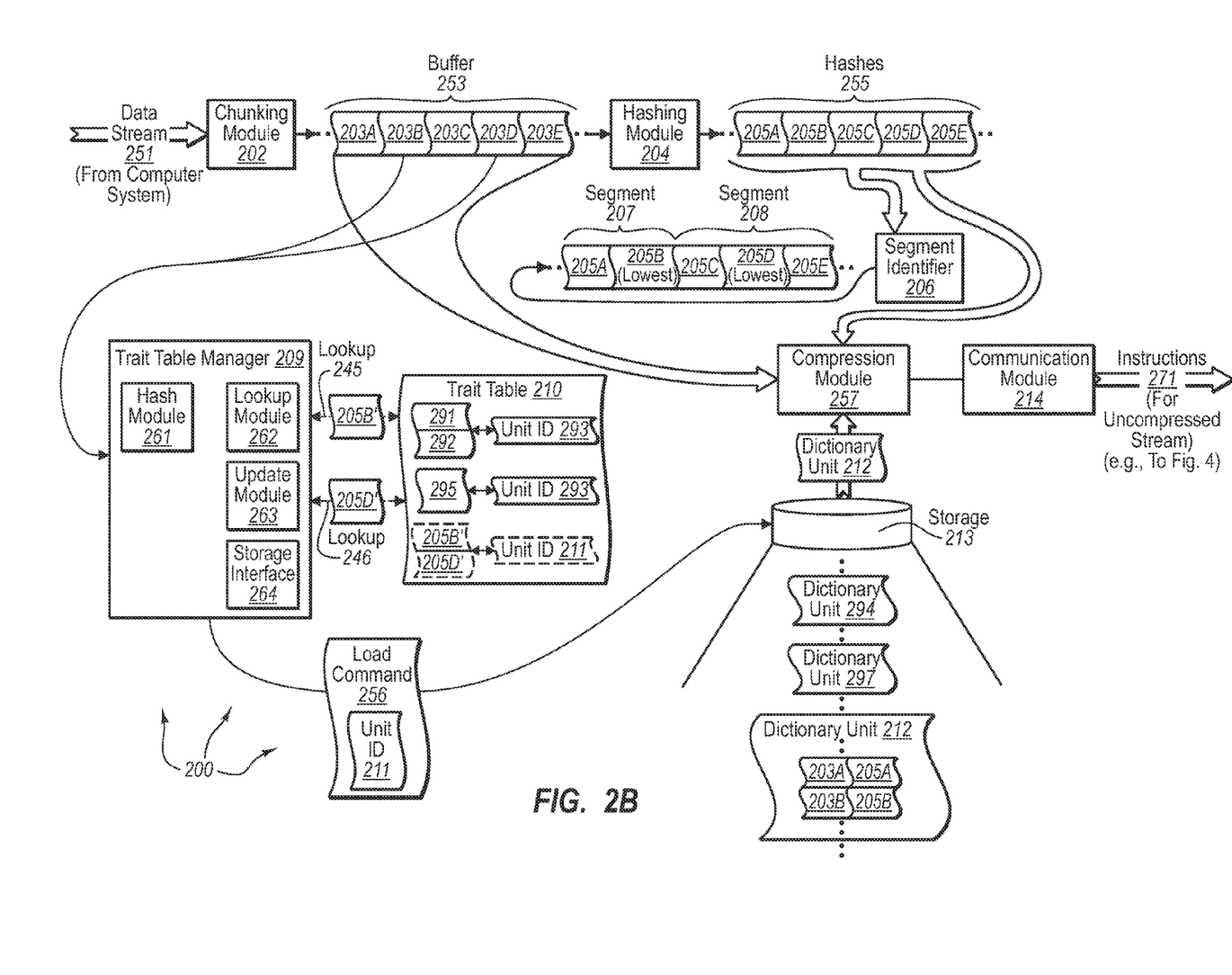
FIG. 2B illustrates an example Wide Area Network accelerator architecture configured to perform scalable differential compression of network data.

FIGS. 2A and 2B illustrates an example Wide Area Network accelerator architecture 200 configured to store network data for scalable differential compression. Wide Area Network accelerator architecture 200 can be implemented at any of the acceleration devices 103, 104, 109, 155, 156, and 159, depicted in FIGS. 1A and 1B. As depicted (in one or both of FIGS. 2A and 2B), WAN accelerator architecture 200 includes chunking module 202, hashing module 204, segment identifier 206, hashing module 209, trait table 210, storage 213, compression module 257, and communication module 214.

Chunking module 202 is configured to receive a buffer from a stream of data and partition the buffer into a sequence of chunks (portions). A data-dependent chunking algorithm can be used to determine chunk boundaries. Thus, buffers that share a common sub-interval of data are also likely to have one or more equivalent chunks.

One data-dependent chunking algorithm treats every sub-sequence of 32 bytes as a 32*8 bit number. Any numbers that are divisible by 1231 are designated chunk boundaries. Thus, on average every 1231 bytes will be chunk boundaries. However, this is merely one example of a data-dependent chunking algorithm. It would be apparent to one skilled in the art, after having reviewed this description, those other data-dependent chunking algorithms, in addition to the described data-dependent chunking algorithms, can also be used.

Hashing module 204 is configured to compute a hash value for each chunk. A reasonably collision resistant first hash algorithm can be used to compute a hash for each chunk.

Segment identifier 206 is configured to identify segment boundaries between chucks (and thus also their corresponding hash values) in a buffer. A local segmenting algorithm can be used such that similarly arranged chunks are likely segmented on the same boundaries. Thus, a segment can include one or more hash values. Depending on the segmenting algorithm and/or contained data, a buffer can include zero or more segments. The first segment of an input buffer is conceptually concatenated with the last segment of the previous input buffer.

Chunking module 202, hashing module 204, and segment identifier 206 are also configured to process the contents of a stream of buffers. Thus, in some embodiments, segments may span several buffers.

For each segment, segment identifier 206 can also select a featured chunk based on feature selection criteria. In some embodiments, the feature selection criteria include selecting a chunk that has the lowest numerical hash value in each segment.

Trait table manager 209 is configured to maintain a list of segment features and corresponding unit IDs for saved dictionary units. Trait table manager includes hash module 261, lookup module 262, update module 263, and storage interface module 264. Hash module 261 is configured to compute a hash value for each featured chunk. Hash module 261 can use a second different hash algorithm. The hash values computed by hash module 261 are used as segment keys. Each segment key identifies some feature of the corresponding segment such that two segments (e.g., a current and previously received segment) potentially have a large number of consecutive bytes when their traits coincide.

Lookup module 262 is configured to scan trait table 210 for segment keys corresponding to previously cached data that match segment keys for currently received data. Update module 263 is configured to update trait table 210 with one or more segment keys for currently received data and a corresponding unit ID, for example, when segment keys for currently received data do not match any segment keys previously stored in trait table 210.

Storage interface 264 is configured to interface with (e.g., store, load, purge, etc.) dictionary units stored at storage 213. Storage interface 264 can load a stored dictionary unit in response to an indication from lookup module 262 that a segment key match was detected. Thus, cached data can be stored on disk and subsequently loaded into system memory when appropriate, but is not required to remain cached in system memory. Cached data also remains stored on disk after being loaded into system memory. Thus, if cached data is removed from system memory after some amount of time, it can be subsequently reloaded upon detection of another appropriate key segment match.

Storage interface 264 can also create a dictionary unit of currently received data from a buffer and associate the dictionary unit with a unit ID stored in trait table 210, in response to commands from update module 263. Storage interface 264 can subsequently store the created dictionary unit in storage 213.

Storage 213 is configured to store (cache) dictionary units of data received at chunking module 202. A dictionary unit maintains an association between a calculated hash value (from hashing module 204) and a corresponding chunk of data such that hash values can be used to search for a chunk of data within a dictionary unit. In some embodiments, the storage capacity of storage 213 (potentially significantly) exceeds the storage capacity the system memory available to Wide Area Network accelerator architecture 200. Accordingly, data received at Wide Area Network accelerator architecture 200 can be retained for longer periods of time and potentially used more often for data compression.

Compression module 257 is configured to formulate buffer instructions based on the content of a received buffer and any compression available through access to dictionary units. Compression module 257 can replace portions of a buffer with lengths and offsets into dictionary units to reduce the amount of data that is transferred over a WAN. Formulated buffer instructions can identify compressed and/or uncompressed data.

Communication module 214 can transfer formulated buffer instructions from Wide Area Network accelerator architecture 200 to another compatible WAN acceleration device. Communication module 214 can also formulate buffer instructions when appropriate, for example, when only uncompressed data is being transferred.

Figure 5:
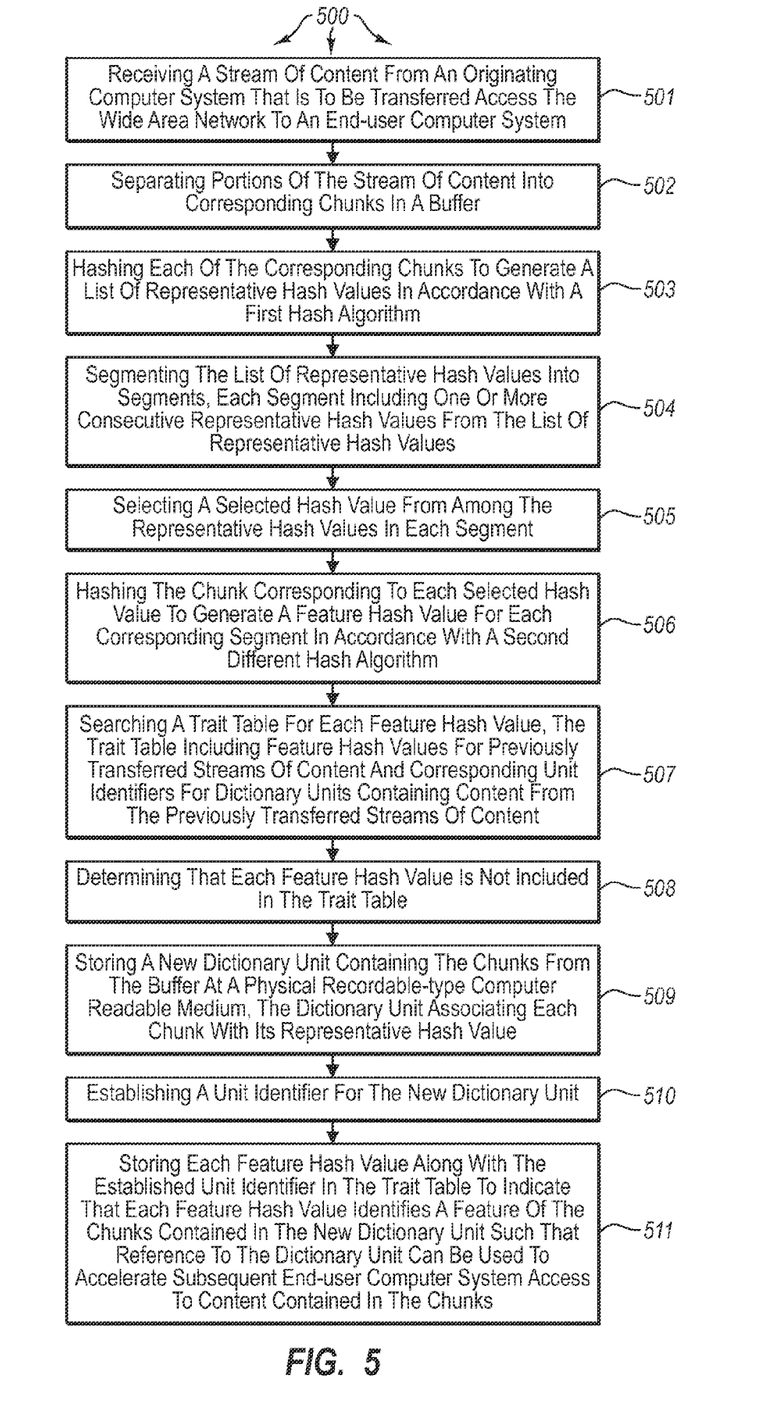
FIG. 5 illustrates a flow chart of an example method for storing network data for scalable differential compression.

FIG. 5 illustrates a flow chart of an example method 500 for storing network data for scalable differential compression. Method 500 will be described primarily with respect to the components and data in FIG. 2A and with occasional reference to FIG. 1A.

Method 500 includes an act of receiving a stream of content from an originating computer system that is to be transferred access the Wide Area Network to an end-user computer system (act 501). For example, in FIG. 1A, acceleration device 103 can receive a stream of content from computer system 101 that is to be transferred over WAN 107 to computer system 110. The stream of data can be delivered to a chunking module of acceleration device 103. For example, in FIG. 2A, chunking module 202 can receive data stream 201.

Method 500 includes an act of separating portions of the stream of content into corresponding chunks in a buffer (act 502). Within acceleration device 103 for example, chunking module 202 can separate data stream 201 into chunks 203A through 203E of buffer 203. A series of two periods (an ellipsis) indicates that other chunks can come before chunk 203A or after chunk 203E.

Method 500 includes an act of hashing each of the corresponding chunks to generate a list of representative hash values in accordance with a first hash algorithm (act 503). Within acceleration device 103 for example, hashing module 204 can hash chunks 203A through 205E into hashes 205. Hashes 205 can include corresponding hashes 205A through 205E respectively.

Method 500 includes an act of segmenting the list of representative hash values into segments, each segment including one or more consecutive representative hash values from the list of representative hash values (act 504). Within acceleration device 103 for example, segment identifier 206 can segment hashes 205 at least into segments 207 and 208. Method 500 includes an act of selecting a selected hash value from among the representative hash values in each segment (act 505). Within acceleration device 103 for example, segment identifier 206 can select hash 205B within segment 207 and hash 205D within segment 208. Hashes 205B and 205D can be selected for having the lowest numerical value of the hashes in segments 207 and 208 respectively.

Method 500 includes an act of hashing the chunk corresponding to each selected hash value to generate a feature hash value for each corresponding segment in accordance with a second different hash algorithm (act 506). Within acceleration device 103 for example, hash module 261 hashes chunks 203B and 203D to generate hashes 205B' and 205D' for corresponding segments 207 and 208 respectively. Hash module 261 can utilize a different hash algorithm than hash module 204.

Method 500 includes an act of searching a trait table for each feature hash value, the trait table including feature hash values for previously transferred streams of content and corresponding unit identifiers for dictionary units containing content from the previously transferred streams of content (act 507). Within acceleration device 103 for example, lookup module 262 can perform lookups 241 and 242 to search for hash values 205B'and 205D'within trait table 210. As depicted in FIG. 2A, trait table 210 includes hash values 291 and 292 associated with unit ID 293 (for dictionary unit 294) and has value 295 associated with unit ID 296 (for dictionary unit 297).

Method 500 includes an act determining that each feature hash value is not included in the trait table (act 508). Within acceleration device 103 for example, lookup module 262 can determine that hash values 205B' and 205D' are not included in trait table 210.

Method 500 includes an act of storing a new dictionary unit containing the chunks from the buffer at a physical recordable-type computer-readable medium, the dictionary unit associating each chunk with its representative hash value (act 509). Within acceleration device 103 for example, update module 263 can issue commands to storage interface 263 to store dictionary unit 212 at storage 213. Dictionary unit 212 can associate each chunk of buffer 203 with its representative hash value from hashes 205. Storage 213 can be a magnetic or optical mass storage device capable of storing significantly more data than the system memory available to Wide Area Network accelerator architecture 200 is capable of storing.

Method 500 includes an act of establishing a unit identifier for the new dictionary unit (act 510). Within acceleration device 103 for example, update module 263 can establish unit ID 296 for dictionary unit 212. Method 500 includes an act of storing each feature hash value along with the established unit identifier in the trait table to indicate that each feature hash value identifies a feature of the chunks contained in the new dictionary unit such that reference to the dictionary unit can be used to accelerate subsequent end-user computer system access to content contained in the chunks (act 511). Within acceleration device 103 for example, update module 263 can perform updates 243 and 244 to store hash values 205B' and 205D' along with unit ID 211. Storage of hash values 205B' and 205D' along with unit ID 211 indicates hash values 205B' and 205D' identify features of the chunks (e.g., 205A-205D). Accordingly, reference to dictionary unit 212 can used to accelerate subsequent tend-user computer system access to the contents of chunks 205A-205D.

When no feature hash values match, a buffer is forwarded to communication module 214. For example buffer 203 can be forwarded to communication module 214. Communication module 214 formulates instructions 221 (buffer instructions). Instructions 221 indicate to another WAN acceleration device (e.g., in the communication path to the end-user computer system) that the other WAN acceleration device is to access the data from buffer 203 from within instructions 221. For example, referring briefly again to FIG. 1A, acceleration device 103 can formulate buffer instructions that indicate to acceleration device 109 to access buffer content (originating from computer system 101) from within the buffer instructions formulated at acceleration device 103.

Instructions 221 can also include dictionary unit creation instructions. The dictionary unit creation instructions can instruct the other WAN acceleration device (e.g., acceleration device 109) to create dictionary unit 212. The other WAN acceleration device can have similarly configured modules to Wide Area Network accelerator architecture 200 such that hash value creation, trait table maintenance, dictionary unit storage, and other functionality is also similar to that of Wide Area Network accelerator architecture 200. Accordingly, in response to instructions from communication module 214, the other WAN acceleration device can also store dictionary unit 212 at a storage device and associate hash values 205B' and 205D' with unit ID 211. For example, referring briefly again to FIG. 1, acceleration device 109 can perform these and other operations in response to receiving buffer instructions from acceleration device 103.

Figure 6:
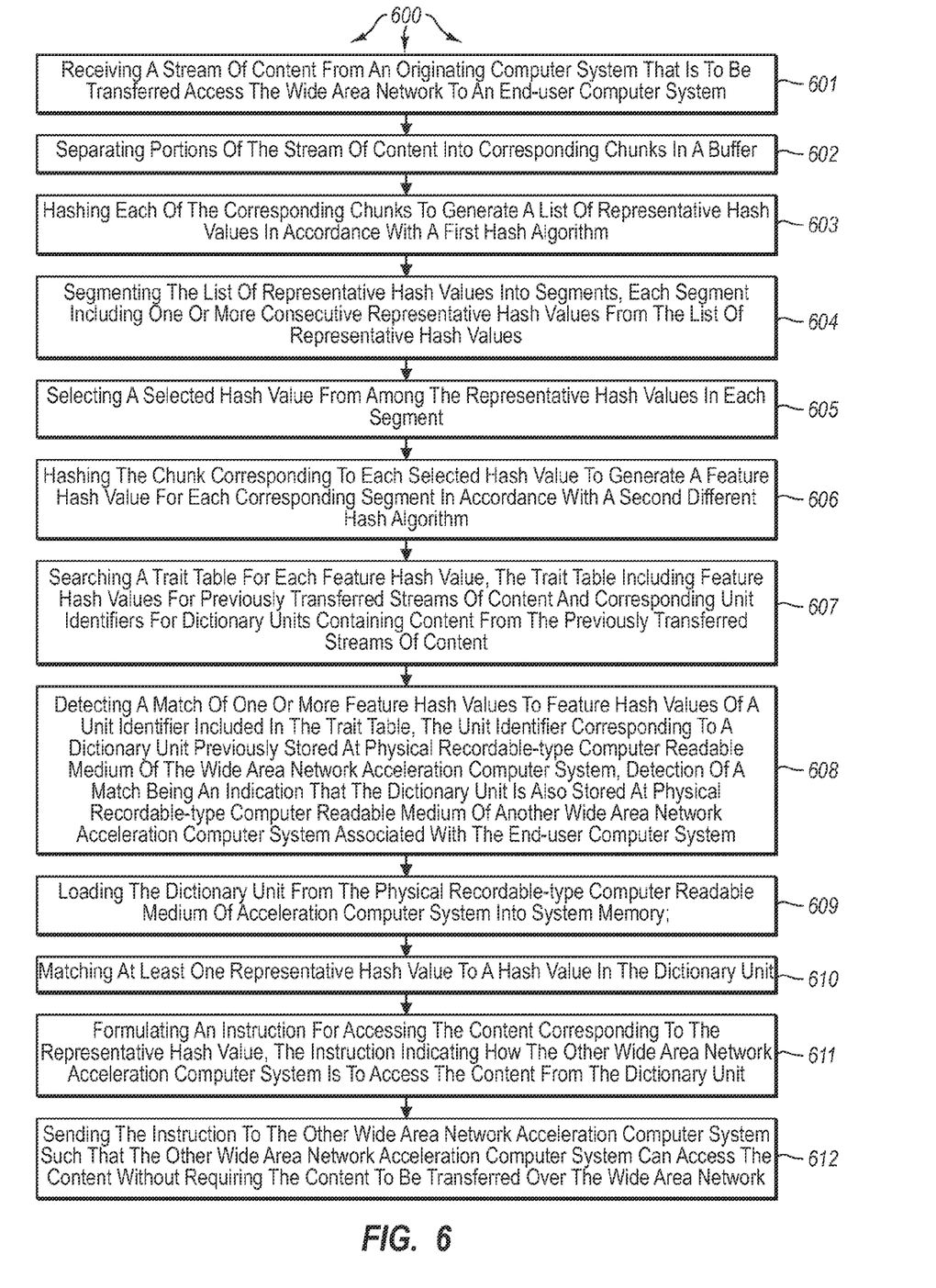
FIG. 6 illustrates a flow chart of an example method for performing scalable differential compression of network data.

FIG. 6 illustrates a flow chart of an example method 600 for performing scalable differential compression of network data. Method 600 will be described primarily with respect to the components and data in FIG. 2A and with occasional reference to FIG. 1A.

Method 600 includes an act of receiving a stream of content from an originating computer system that is to be transferred access the Wide Area Network to an end-user computer system (act 601). For example, in FIG. 1A, acceleration device 103 can receive another stream of content from computer system 101 that is to be transferred over WAN 107 to computer system 110. Alternately, acceleration device 109 may receive a return stream of content from computer system 110 that is to be transferred over WAN 107 to computer system 101. The other stream of data can be delivered to a chunking module of the acceleration device (103 or 109). For example, in FIG. 2B, chunking module 202 can receive data stream 251. Data stream 251 can have at least some data that is very similar or identical to data from data stream 201.

Method 600 includes an act of separating portions of the stream of content into corresponding chunks in a buffer (act 602). Within acceleration device 103 or 109 for example, chunking module 202 can separate data stream 251 at least into chunks 203A through 203E of buffer 253.

Method 600 includes an act of hashing each of the corresponding chunks to generate a list of representative hash values in accordance with a first hash algorithm (act 603). Within acceleration device 103 or 109 for example, hashing module 204 can hash chunks 203A through 205E into hashes 205. Hashes 205 can include corresponding hashes 205A through 205E respectively.

Method 600 includes an act of segmenting the list of representative hash values into segments, each segment including one or more consecutive representative hash values from the list of representative hash values (act 604). Within acceleration device 103 or 109 for example, segment identifier 206 can segment hashes 205 at least into segments 207 and 208. Method 600 includes an act of selecting a selected hash value from among the representative hash values in each segment (act 605). Within acceleration device 103 or 109 for example, segment identifier 206 can select hash 205B within segment 207 and hash 205D within segment 208. Hashes 205B and 205D can be selected for having the lowest numerical value of the hashes in segments 207 and 208 respectively.

Method 600 includes an act of hashing the chunk corresponding to each selected hash value to generate a feature hash value for each corresponding segment in accordance with a second different hash algorithm (act 606). Within acceleration device 103 or 109 for example, hash module 261 hashes chunks 203B and 203D to generate hashes 205B' and 205D' for corresponding segments 207 and 208 respectively. Hash module 261 can utilize a different hash algorithm than hash module 204.

Method 600 includes an act of searching a trait table for each feature hash value, the trait table including feature hash values for previously transferred streams of content and corresponding unit identifiers for dictionary units containing content from the previously transferred streams of content (act 607). Within acceleration device 103 or 109 for example, lookup module 262 can perform lookups 245 and 246 to search for hash values 205B'and 205D'within trait table 210.

In some embodiments, compression module 257 scans dictionary units loaded in system memory before searching trait table 210. If a match is found in system memory, acts 608 and 609 may be skipped.

Method 600 includes an act of detecting a match of one or more feature hash values to feature hash values of a unit identifier included in the trait table, the unit identifier corresponding to a dictionary unit previously stored at physical recordable-type computer-readable medium of the wide area network acceleration computer system, detection of a match being an indication that the dictionary unit is also stored at physical recordable-type computer-readable medium of another wide area network acceleration computer system associated with the end-user computer system (act 608). Within acceleration device 103 or 109 for example, lookup module 262 can detect that values 205B' and 205D' both match to unit ID 211 corresponding to dictionary unit 212. A detected match indicates that previously sent data is likely to similar to current sent data. For example, a detected match indicates that currently sent data is likely contained in dictionary unit 212. Thus, to indicate that a dictionary unit includes previously transferred data, a minimal number of comparisons (e.g., one per segment), and potentially a single comparison (e.g., when a buffer includes a single segment), are performed. Accordingly, there is minimal overhead associated with identifying a relevant dictionary unit that can be used to compress data.

Method 600 includes an act of loading the dictionary unit from the physical recordable-type computer-readable medium of acceleration computer system into system memory (act 609). Within acceleration device 103 or 109 for example, storage interface 264 can issue load command 256 to storage 213. In response to load command 256, dictionary unit 212 can be loaded from storage 213 into system memory available to Wide Area Network accelerator architecture 200.

In some embodiments, storage interface 264 checks system memory to determine if dictionary unit 212 is already loaded in system memory, prior to issuing load command 256. When dictionary unit 212 is already loaded into system memory, storage interface 264 may not issue load command 256.

Subsequently, compression module 257 can receive buffer 253, hashes 255, and dictionary unit 212 as input.

Method 600 includes an act of matching at least one representative hash value to a hash value in the dictionary unit (act 610). Within acceleration device 103 or 109 for example, compression module 257 can match hashes values form hashes 255 to hash values contained in dictionary unit 212. Method 600 includes an act of formulating an instruction for accessing the content corresponding to the representative hash value, the instruction indicating how the other wide area network acceleration computer system is to access the content from the dictionary unit (act 611). For example, compression module 257 can include an instruction including unit ID 211, an offset within dictionary unit 212, and a length from the offset within dictionary unit 212, to indicate to the other wide area network acceleration computer system content corresponding to chunks 203A through 203E can be accessed from dictionary unit 212.

For example, if method 600 is being performed at acceleration device 103, acceleration device 103 can include instructions to acceleration device 109 indicating how acceleration device 109 is to access content from a dictionary unit stored at acceleration device 109. On the other hand, if method 600 is being performed at acceleration device 109, acceleration device 109 can include instructions to acceleration device 103 indicating how acceleration device 103 is to access content from a dictionary unit stored at acceleration device 103.

Method 600 includes an act of sending the instruction to the other wide area network acceleration computer system such that the other wide area network acceleration computer system can access the content without requiring the content to be transferred over the Wide Area Network (act 612). Within acceleration device 103 or 109 for example, communication module 214 can send instructions 271 to another WAN acceleration device. For example, if method 600 is being performed at acceleration device 103, acceleration device 103 can send instructions 271 to acceleration device 109. On the other hand, if method 600 is being performed at acceleration device 109, acceleration device 109 can send instructions 271 to acceleration device 103.

WAN acceleration devices can utilize a variety of different instruction types and formats to exchange data compression information. A copy instruction can be used to indicate how a WAN acceleration device is to access previously transferred content, for example, from within a dictionary unit. A data instruction can be used to transfer raw bytes of data that have not been previously transferred. A new dictionary instruction can be used to instruct a WAN acceleration device to create (store) a new dictionary unit. A purge dictionary instruction can be used to instruct a WAN acceleration device to purge (delete) an existing new dictionary unit with the Unit ID indicated by the sender.

Figure 3:
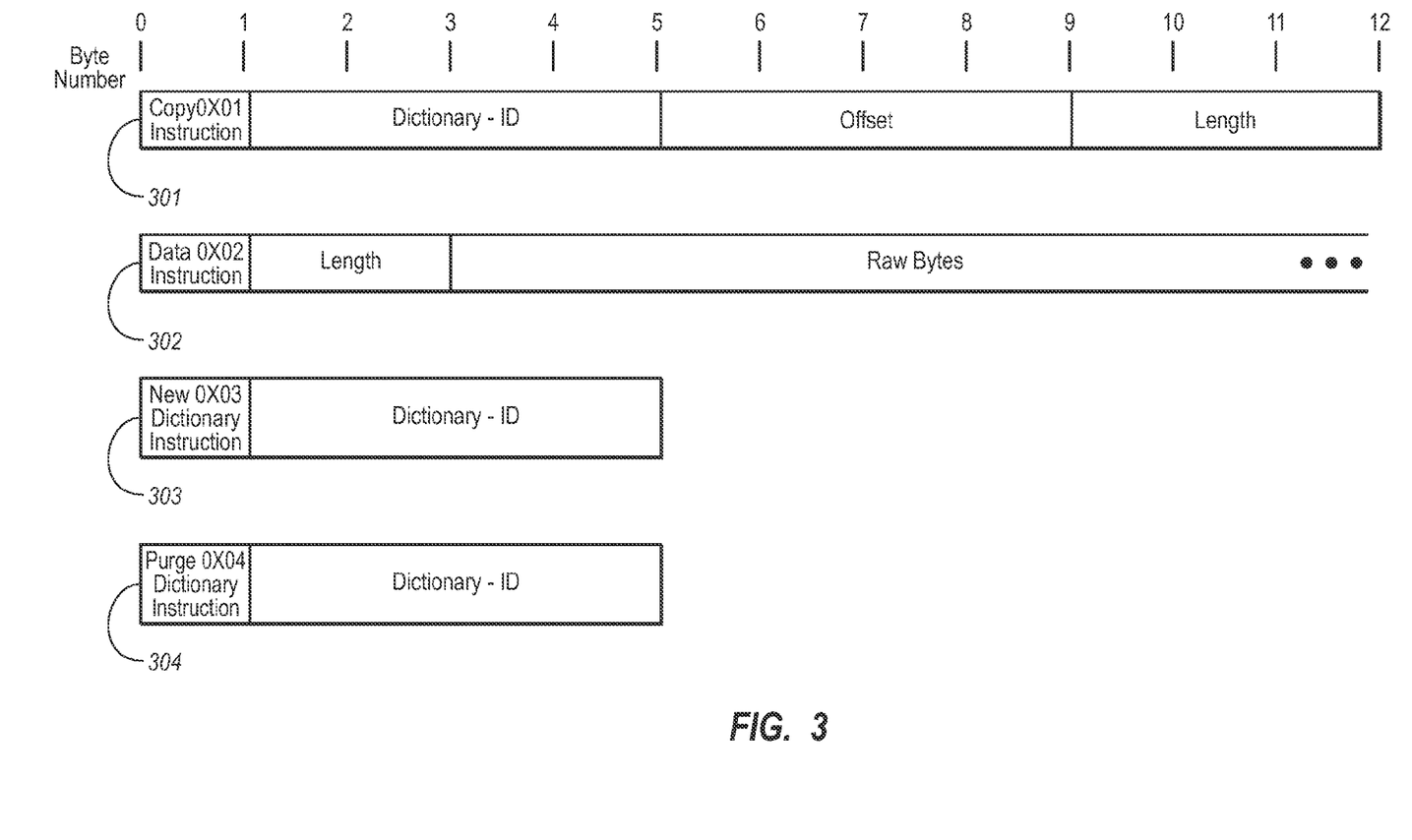
FIG. 3 illustrates example instructions that can be exchanged between Wide Area Network accelerators to facilitate scalable differential compression of network data.

FIG. 3 illustrates example instructions that can be exchanged between Wide Area Network accelerators to facilitate scalable differential compression of network data. Generally, instructions can include a one byte instruction type field to indicate the type of instruction. For example, 0x01 can indicate a copy instruction, 0x02 can indicate a data instruction, 0x03 can indicate a new dictionary unit instruction, and 0x04 can indicate a purge dictionary instruction.

The remaining length and contents of each type of instruction can vary. For example, copy instruction 301 includes a four byte dictionary-ID value, a four byte offset value, and a three byte length value. The offset value indicates an offset into the dictionary unit identified by the dictionary-ID value. The length value indicates a length from the offset value within the dictionary unit identified by the dictionary-ID value. Thus, a copy instruction identifies a portion of data previously sent through an acceleration device that is to be copied from a dictionary unit for transfer to an end-user computer system Data instruction 302 includes a two byte length value and a variable number of raw bytes. The raw bytes contain data that has not been previously transferred through an acceleration device.

New dictionary instruction 303 includes a four byte dictionary-ID. The Dictionary-ID indicates the identifier for a new dictionary unit that is to be created, for example, based on raw bytes in an associated data instruction.

Purge dictionary instruction 304 includes a four byte dictionary-ID. This dictionary-ID indicates the identifier for an existing dictionary unit that is to be purged Accordingly, a first Wide Area Network accelerator can formulate a series of instructions to instruct a second Wide Area Network accelerator to perform dictionary unit related operations. The first Wide Area Network accelerator can send the instructions to the second Wide Area Network accelerator. The second Wide Area Network accelerator can receive and process the instructions to appropriately update existing dictionary units and/or access data for further transfer to an end-user computer system.

Figure 4:
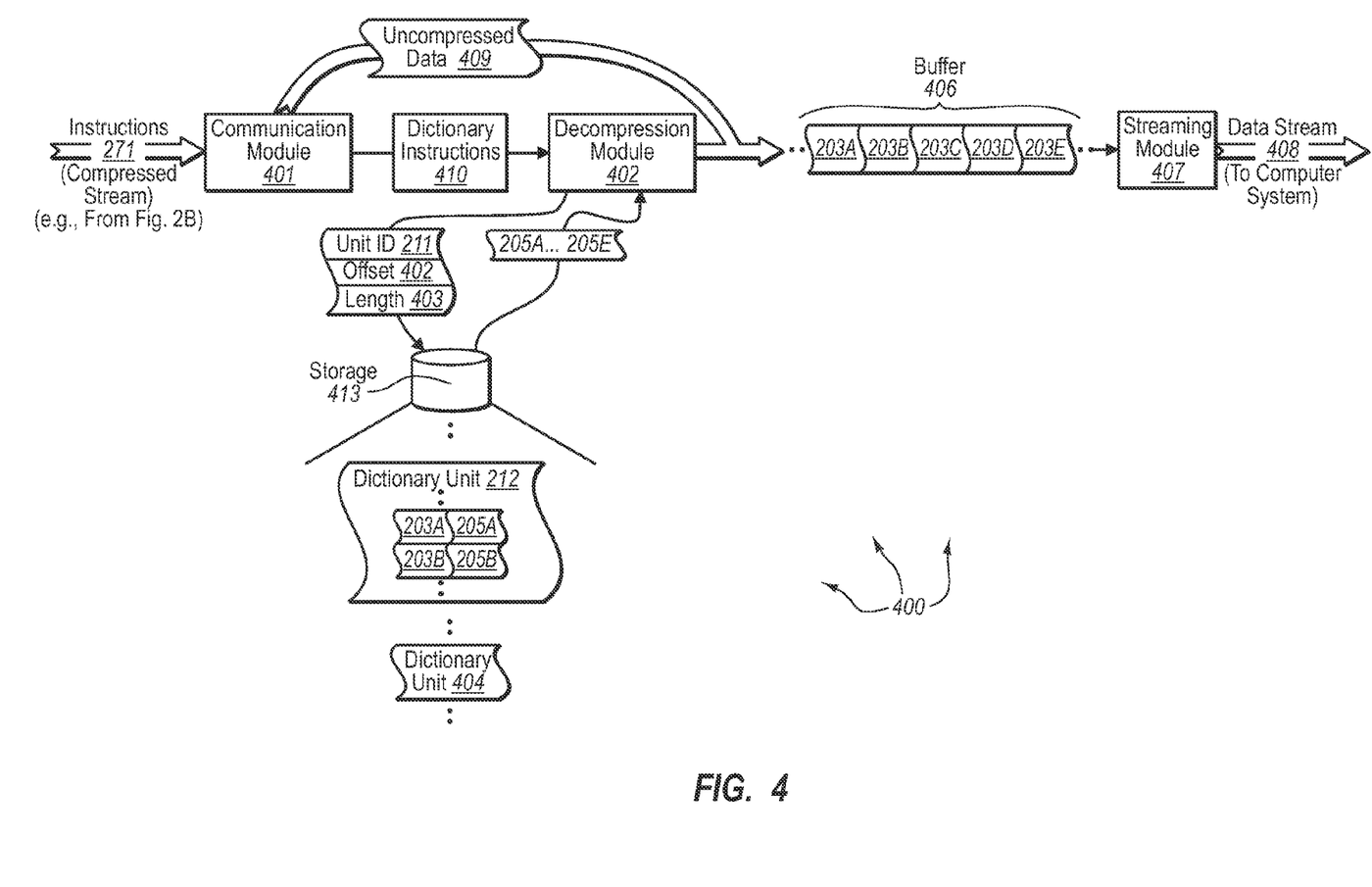
FIG. 4 illustrates an example Wide Area Network accelerator architecture configured to decompress differentially compressed network data.

FIG. 4 illustrates an example Wide Area Network accelerator architecture 400 configured to decompress differentially compressed network data. As depicted, accelerator architecture 400 includes communication module 401, decompression module 402, streaming module 407, and storage 413.

Communication module 401 is configured to transfer formulated buffer instructions from another WAN acceleration device into Wide Area Network accelerator architecture 400. Communication module 401 is also configured to separate dictionary instructions from uncompressed data within a sequence of buffer instructions.

Decompression module 402 is configured to receive and implement dictionary instructions from another WAN acceleration device. Decompression module 402 can access data from existing dictionary units and insert the accessed data into a buffer for delivery to an end-user computer system. Decompression module 402 can also create and store new dictionary units and purge and delete existing dictionary units in response to dictionary instructions. Thus, decompression module 402 is configured to interface with (e.g., store, load, purge, etc.) dictionary units stored at storage 413.

Similar to storage 213, storage 413 is configured to store (cache) dictionary units of data received form another WAN acceleration device (or an appropriate chunking module (not depicted)). Stored dictionary units can include uncompressed bytes received another WAN acceleration device.

Streaming module 407 is configured to receive a buffer of data and stream the data to an end-user computer system.

Wide Area Network accelerator architecture 400 can also include modules and data for processing streams of bytes or streams of buffers such that a received stream can be used for indexing compression in the reverse direction. That is, Wide Area Network accelerator architecture 400 can include modules similar to chunking module 202, hashing module 204, segment identifier 206, and trait table manager 209 and a trait table similar to trait table 201. Within Wide Area Network accelerator architecture 400, these modules and data can interoperate as previously described to store new dictionary units and access existing dictionary units. Thus, dictionary units can be created at Wide Area Network accelerator architecture 400 as a side effect of receiving data from another Wide Area Network accelerator or an end-user computer system.

Accordingly, when similar or identical data to previously received data is subsequently sent from Wide Area Network accelerator architecture 400 to another Wide Area Network accelerator, compression can be used. This can be particularly advantageous in an environment where Wide Area Network accelerator architecture 400 forwards a document to an end-user computer system, a user makes minor modifications to the document at the end-user computer system, and the use then saves the document back to the original location.

Figure 7:
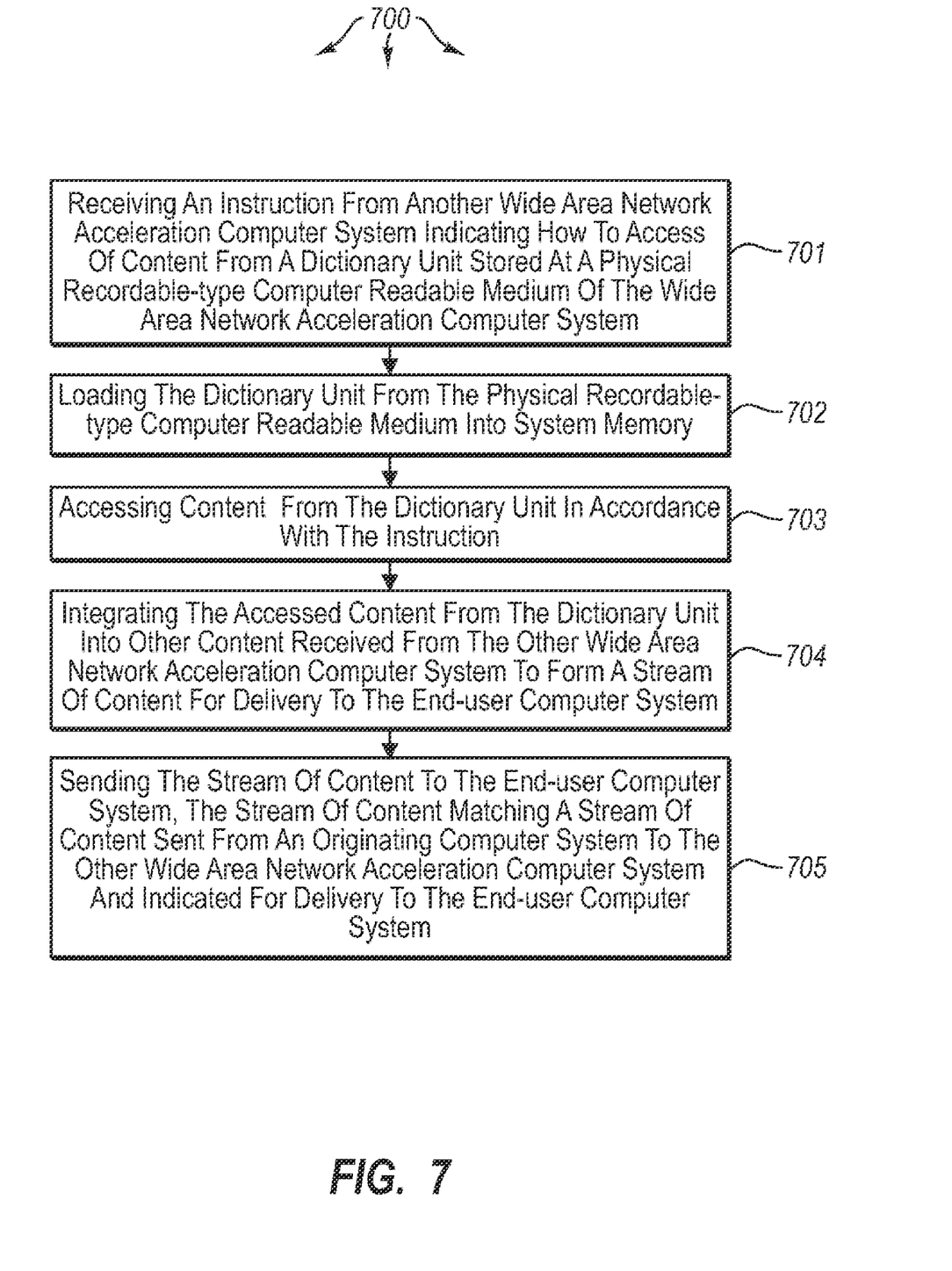
FIG. 7 illustrates a flow chart of an example method for decompressing differentially compressed network data.

FIG. 7 illustrates a flow chart of an example method 700 for decompressing differentially compressed network data. Method 700 will be described with respect to the components and data of FIG. 4 with occasional reference to FIGS. 1A and 2B.

Method 700 includes an act of receiving an instruction from another wide area network acceleration computer system indicating how to access content from a dictionary unit stored at a physical recordable-type computer-readable medium of the wide area network acceleration computer system (act 701). It may be that acceleration device 103 includes component similar to Wide Area Network accelerator architecture 200 and acceleration device 109 includes components similar to Wide Area Network accelerator architecture 400. Thus, buffer instructions can be delivered from acceleration device 103 to a communication module of acceleration device 109. For example, in FIG. 4, communication module 401 can receive instructions 271 (from communication module 214).

Instructions 271 can potentially include one or more of each of the different instructions of FIG. 3. Communication module 401 can separate raw bytes form any data instructions into uncompressed data 409. Similarly, communication module 401 can separate any dictionary related instructions (copy, new dictionary, or purge dictionary) into dictionary instructions 410. Uncompressed data 409 can be retained for insertion into buffer 406. Dictionary instructions 410, including copy instruction 451, can be transferred to decompression module 402.

As depicted, copy instruction 451 includes unit ID 211, offset 402, and length 403. Receiving unit ID 211 indicates to decompression module 402 that data is to be accessed from dictionary unit 212.

Method 700 includes an act of loading the dictionary unit from the physical recordable-type computer-readable medium into system memory (act 702). Within acceleration device 109 for example, dictionary unit 212 can be loaded into system memory available to Wide Area Network accelerator architecture 400. Method 700 includes an act of accessing content from the dictionary unit in accordance with the instruction (act 703). Within acceleration device 109 for example, decompression module 402 can utilize offset 402 (e.g., indicating an offset from the beginning of dictionary unit 212 to chunk 203A) and length 403 (e.g., indicating chunks 205A through 205E), to access chunks 205A through 205E form dictionary unit 212.

Method 700 includes an act of integrating the accessed content from the dictionary unit into other content received from the other wide area network acceleration computer system to form a stream of content for delivery to the end-user computer system (act 704). Within acceleration device 109 for example, chunks 205A through 205E can be integrated with uncompressed data 409 to form buffer 406. Buffer 406 can then be sent to streaming module 407, which forms a stream of content for delivery to the end-user computer system (e.g., computer system 110).

Method 700 includes an act of sending the stream of content to the end-user computer system, the stream of content matching a stream of content sent from an originating computer system to the other wide area network acceleration computer system and indicated for delivery to the end-user computer system (act 705). Within acceleration device 109 for example, streaming module 407 can send data stream 408 to the end-user computer system (e.g., computer system 110). Stream 408 can match a stream of content (e.g., data stream 251) sent from an originating computer system (e.g., computer system 101) to the other wide area network acceleration computer system (e.g., acceleration device 103) and indicated for delivery to the end-user computer system (e.g., computer system 110).

Embodiments for dictionary unit creation, compression, decompression, etc. have been described with some reference to different architecture figures and flow charts. However, it would be apparent to one skilled in the art, after reading this description, that the modules, data, and functionality described in the different figures can be combined within a single network acceleration device. Thus, any of the acceleration devices depicted in FIGS. 1A and 1B can include some or all of the functionality to create dictionary units, compress data, and decompress data in accordance with the principles of the present invention.

Embodiments of the invention utilize physical recordable-type computer-readable media to store cached network data. The physical recordable-type computer-readable media have (potentially significantly) larger storage capacities than available system memory. Thus, retention times for cached network data are corresponding increased. Accordingly, there is increased likelihood of being able to conserve Wide Area Network bandwidth (through data compression) when subsequently transferring the cached network data between Wide Area Network acceleration devices. Further, cached network data is indexed through features taken from a subset of the cached data (e.g., per segment) to reduce overhead associated with searching for cached network data to use for compression. When a feature match is detected between received and cached network data, the cached network data can be loaded from physical recordable-type computer-readable media into system memory for more efficient access.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed:

1. A method for use at a wide area network acceleration computer system communicatively coupled to a Wide Area Network, the wide area network acceleration computer system including modules configured to accelerate access to content across the Wide Area Network, the method for storing received content to accelerate subsequent access to the received content, the method comprising:
    an act of receiving a stream of content from an originating computer system that is to be transferred access the Wide Area Network to an end-user computer system;
    an act of separating portions of the stream of content into corresponding chunks in a buffer;
    an act of hashing each of the corresponding chunks to generate a list of representative hash values in accordance with a first hash algorithm;
    an act of segmenting the list of representative hash values into segments, each segment including one or more consecutive representative hash values from the list of representative hash values;
    an act of selecting a selected hash value from among the representative hash values in each segment;
    an act of hashing the chunk corresponding to each selected hash value to generate a feature hash value for each corresponding segment in accordance with a second different hash algorithm;
    an act of searching a trait table for each feature hash value, the trait table including feature hash values for previously transferred streams of content and corresponding unit identifiers for dictionary units containing content from the previously transferred streams of content;
    an act of determining that each feature hash value is not included in the trait table;
    an act of storing a new dictionary unit containing the chunks from the buffer at a physical recordable-type computer-readable medium, the dictionary unit associating each chunk with its representative hash value;
    an act of establishing a unit identifier for the new dictionary unit; and
    an act of storing each feature hash value along with the established unit identifier in the trait table to indicate that each feature hash value identifies a feature of the chunks contained in the new dictionary unit such that reference to the dictionary unit is used to accelerate subsequent end-user computer system access to content contained in the chunks.

2. The method as recited in claim 1, wherein the act of receiving a stream of content comprises an act of receiving a stream of content that is to be delivered across the Internet.

3. The method as recited in claim 1, wherein the act of separating portions of the stream of content into corresponding chunks in a buffer comprises an act of separating portions of the stream of content in accordance with a data-dependent chunking algorithm.

4. The method as recited in claim 1, wherein the act of selecting a selected hash value from among the representative hash values in each segment comprises an act of selecting the hash value having the lowest numerical value in each segment as the selected hash for that segment.

5. The method as recited in claim 1, wherein the act of storing a new dictionary unit containing the chunks from the buffer at a physical recordable-type computer-readable medium comprises an act of storing the dictionary unit at a magnetic disk that has more storage capacity than the storage capacity of the system memory available to the wide area network acceleration computer system.

6. The method as recited in claim 1, further comprising:

an act of sending the separated portions of the stream of content to another wide area network acceleration computer system associated with the end-user computer system; and an act of sending dictionary creation instructions to the other wide area network acceleration computer system, the dictionary creation instructions indicating how to create the dictionary unit from separated portions of the stream of content.

7. The method as recited in claim 6, wherein the act of sending the separated portions of the stream of content comprises an act of sending a data instruction to the other wide area network acceleration computer system, the data instruction including the raw bytes of the separated portions of the stream of content.

8. A method for use at a wide area network acceleration computer system communicatively coupled to a Wide Area Network, the computer system including modules configured to accelerate access to content across the Wide Area Network, the method for accelerating access to received content directed to an end-user computer system, the method comprising:

an act of receiving a stream of content from an originating computer system that is to be transferred access the Wide Area Network to an end-user computer system;

an act of separating portions of the stream of content into corresponding chunks in a buffer;

an act of hashing each of the corresponding chunks to generate a list of representative hash values in accordance with a first hash algorithm;

an act of segmenting the list of representative hash values into segments, each segment including one or more consecutive representative hash values from the list of representative hash values;

an act of selecting a selected hash value from among the representative hash values in each segment;

an act of hashing the chunk corresponding to each selected hash value to generate a feature hash value for each corresponding segment in accordance with a second different hash algorithm;

an act of searching a trait table for each feature hash value, the trait table including feature hash values for previously transferred streams of content and corresponding unit identifiers for dictionary units containing content from the previously transferred streams of content;

an act of detecting a match of one or more feature hash values to feature hash values of a unit identifier included in the trait table, the unit identifier corresponding to a dictionary unit previously stored at physical recordable-type computer-readable medium of the wide area network acceleration computer system, detection of a match being an indication that the dictionary unit is also stored at physical recordable-type computer-readable medium of another wide area network acceleration computer system associated with the end-user computer system;

an act of loading the dictionary unit from the physical recordable-type computer-readable medium of acceleration computer system into system memory;

an act of matching at least one representative hash value to a hash value in the dictionary unit;

an act of formulating an instruction for accessing the content corresponding to the representative hash value, the instruction indicating how the other wide area network acceleration computer system is to access the content from the dictionary unit;

an act of sending the instruction to the other wide area network acceleration computer system such that the other wide area network acceleration computer system can access the content without requiring the content to be transferred over the Wide Area Network.

9. The method as recited in claim 8, further comprising:
an act of scanning system memory for the dictionary unit prior to searching the trait table.

10. The method as recited in claim 8, further comprising:
an act of scanning system memory for the dictionary unit prior to loading the dictionary unit from the physical recordable-type computer-readable medium.

11. The method as recited in claim 8, wherein the act of formulating an instruction for accessing the chunk comprises an act of formulating a copy instruction that includes a unit ID for the dictionary unit, an offset into the dictionary unit, and a length of data that is to be accessed from the dictionary unit.

12. The method as recited in claim 8, wherein the act of receiving a stream of content comprises an act of receiving a stream of content that is to be delivered across the Internet.

13. The method as recited in claim 12, wherein the act of selecting a selected hash value from among the representative hash values in each segment comprises an act of selecting the hash value having the lowest numerical value in each segment as the selected hash for that segment.

14. The method as recited in claim 8, wherein the act of sending the instruction to the other wide area network acceleration computer system comprises an act of sending different types of instructions to the other wide area network acceleration computer system, including one or more copy instructions and one or more data instructions.

15. The method as recited in claim 14, wherein the act of sending different types of instructions to the other wide area network acceleration computer system, including one or more copy instructions and one or more data instructions comprises an act of sending dictionary creation instructions corresponding to the one or more data instructions so as to indicate to the other wide area network acceleration computer system how to create dictionary units for raw bytes contained in data instructions.

16. A computer program product for use at a wide area network acceleration computer system communicatively coupled to a Wide Area Network, the computer system including modules configured to accelerate access to content across the Wide Area Network, the computer program product for implementing a method for storing received content to accelerate subsequent access to the received content, the computer program product comprising one or more non-transitory computer readable storage media having stored thereon computer-executable instructions that, when executed at a processor, cause the computer system to perform the method, including the following:

receive a stream of content from an originating computer system that is to be transferred access the Wide Area Network to an end-user computer system;

separate portions of the stream of content into corresponding chunks in a buffer;

hash each of the corresponding chunks to generate a list of representative hash values in accordance with a first hash algorithm;

segment the list of representative hash values into segments, each segment including one or more consecutive representative hash values from the list of representative hash values;

select a selected hash value from among the representative hash values in each segment;

hash the chunk corresponding to each selected hash value to generate a feature hash value for each corresponding segment in accordance with a second different hash algorithm;

search a trait table for each feature hash value, the trait table including feature hash values for previously transferred streams of content and corresponding unit identifiers for dictionary units containing content from the previously transferred streams of content;

determine that each feature hash value is not included in the trait table;

store a new dictionary unit containing the chunks from the buffer at a physical recordable-type computer-readable medium, the dictionary unit associating each chunk with its representative hash value;

establish a unit identifier for the new dictionary unit; and store each feature hash value along with the established unit identifier in the trait table to indicate that each feature hash value identifies a feature of the chunks contained in the new dictionary unit such that reference to the dictionary unit is used to accelerate subsequent end-user computer system access to content contained in the chunks.

17. The computer program product as recited in claim 16, wherein computer-executable instructions that, when executed, cause the computer system to separate portions of the stream of content into corresponding chunks in a buffer comprise computer-executable instructions that, when executed, cause the computer system to separate portions of the stream of content in accordance with a data-dependent chunking algorithm.

18. The computer program product as recited in claim 16, wherein computer-executable instructions that, when executed, cause the computer system to select a selected hash value from among the representative hash values in each segment comprise computer-executable instructions that, when executed, cause the computer system to select the hash value having the lowest numerical value in each segment as the selected hash for that segment.

19. The computer program product as recited in claim 16, further comprising computer-executable instructions that, when executed, cause the computer system to:

send the separated portions of the stream of content to another wide area network acceleration computer system associated with the end-user computer system; and send dictionary creation instructions to the other wide area network acceleration computer system, the dictionary creation instructions indicating how to create the dictionary unit from separated portions of the stream of content.

20. The computer program product as recited in claim 19, wherein computer-executable instructions that, when executed, cause the computer system to send the separated portions of the stream of content comprise computer-executable instructions that, when executed, cause the computer system to send a data instruction to the other wide area network acceleration computer system, the data instruction including the raw bytes of the separated portions of the stream of content.

* * * * *